United States Patent [19]

Moll

[11] 4,106,344
[45] Aug. 15, 1978

[54] HOUSING FOR ELECTRO-MECHANICAL COUNTER

[75] Inventor: Eberhard Moll, Magstadt, Fed. Rep. of Germany

[73] Assignee: Rockwell International Corporation, Pittsburgh, Pa.

[21] Appl. No.: 810,335

[22] Filed: Jun. 27, 1977

[51] Int. Cl.² .......................................... G01D 11/24
[52] U.S. Cl. ..................................................... 73/431
[58] Field of Search ................. 73/431, 273; 324/110, 324/156; 235/94 R

[56] References Cited

U.S. PATENT DOCUMENTS

| | | | |
|---|---|---|---|
| 3,212,339 | 10/1965 | Olmedo | 73/431 |
| 3,308,664 | 3/1967 | Kullmann | 73/273 |
| 3,355,945 | 12/1967 | Perry | 73/431 X |
| 3,731,534 | 5/1973 | Painley et al. | 73/431 X |
| 3,928,788 | 12/1975 | Finnen et al. | 324/156 X |
| 3,943,441 | 3/1976 | Shackford | 324/110 |

FOREIGN PATENT DOCUMENTS

| | | | |
|---|---|---|---|
| 2,318,407 | 2/1977 | France | 73/273 |

Primary Examiner—Richard C. Queisser
Assistant Examiner—Joseph W. Roskos

[57] ABSTRACT

A tamperproof housing for a remote register for a utility meter, constructed of impact-resistant materials and designed for ease of mounting, assembly and accessibility.

4 Claims, 6 Drawing Figures

HOUSING FOR ELECTRO-MECHANICAL COUNTER

BACKGROUND OF THE INVENTION

Utilities have long wrestled with the problem of access to dwellings in order to read their meters. Various methods of reading the meter from outside the house have been proposed. One method currently popular users a counter mounted outside the house, available to the meter reader without the necessity of entry into the home. An indexing electro-mechanical counter of the type shown in U.S. pat. application filed Jan. 14, 1976, having Ser. No. 648,855, and assigned to the assignee of this application, is typical. This counter accumulates the total throughput of the meter, and corresponds with the reading of the register on the meter.

These counters need protection — from the elements, from insects, from vandals and from dishonest customers who would alter the total shown.

SUMMARY OF THE INVENTION

It is, therefore, a primary object of this invention to provide an enclosure that is weather-proof, bug-proof, and people-proof.

It is another object of this invention to provide a housing that incorporates simple mounting, assembly and connection to the meter.

It is a further object of this invention to provide a housing that is attractive, durable, and secure from tampering.

It is yet another object of this invention to provide a housing that has locking means integral with the housing to avoid loss of the locking means.

It is still another object of this invention to provide a housing that can be securely sealed in the assembled condition to prevent undetected access to the counter.

BRIEF DESCRIPTION OF THE DRAWINGS

The invention is illustrated in the accompanying drawings, in which.

DESCRIPTION OF THE INVENTION

Figure 1:
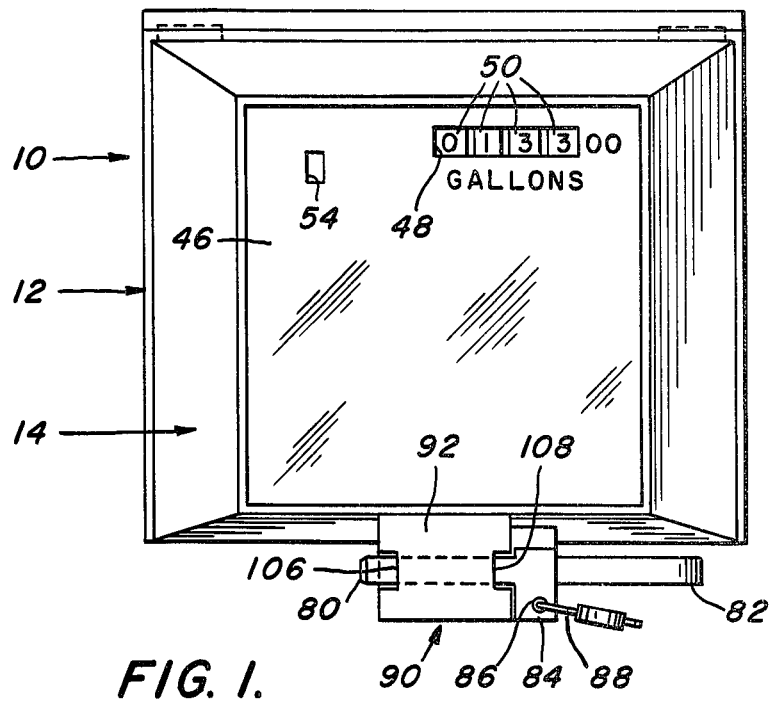
FIG. 1 is a front elevation of the housing as it would appear in place.
Figure 2:
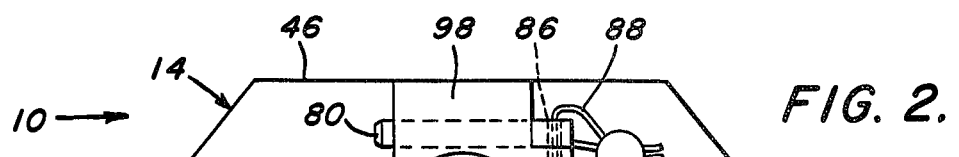
FIG. 2 is a bottom elevation of the housing.

FIGS. 1 and 2 show the housing 10 in assembled relation. The base 12 and mating cover 14 are preferably formed of polycarbonate. The two halves are designed to be close-fitting, to keep out insects, weather, and unauthorized humans.

Figure 5:
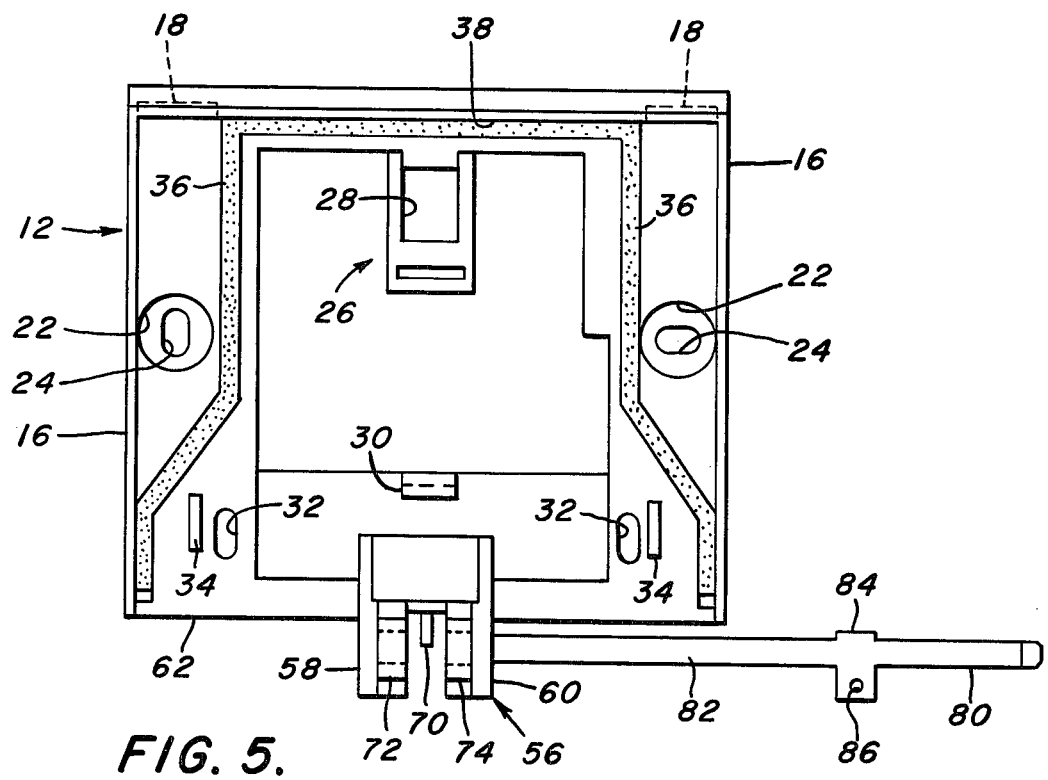
FIG. 5 is a front view of the base member.

Referring now to FIG. 5, we see base 12 as it is molded. An upstanding "collar" 16 (better seen in FIG. 2) extends around three sides, for reception of cover 14. Recesses 18 receive projections 20 on cover 14 to guide and retain the cover. Recesses 22 receive the heads of mounting screws (not shown) for fastening to a wall or the like. The holes 24 are elongated to facilitate orientation of the housing on the selected mounting surface.

The formation 26 serves a dual purpose — a rectangular-shaped hole 28 which is covered almost completely by a plate (not shown) on the back side, provides venting to atmosphere, while keeping out insects, etc. At the same time, it provides clearance for locking members on the counter to orient and retain the counter in the base. In that connection, an L-shaped upstanding tab 30, recesses 32, and tabs 34 are also provided for positioning and retaining the counter and its electrical connections. To further seal out rain, insects and the like, a gasket 36, die cut from foam rubber to fit a molded recess 38, is cemented in place. It can be seen by inspecting FIGS. 5 and 6 that ribs 40 in cover 14 match gasket 36, providing a seal when the cover is locked in place.

Figure 6:
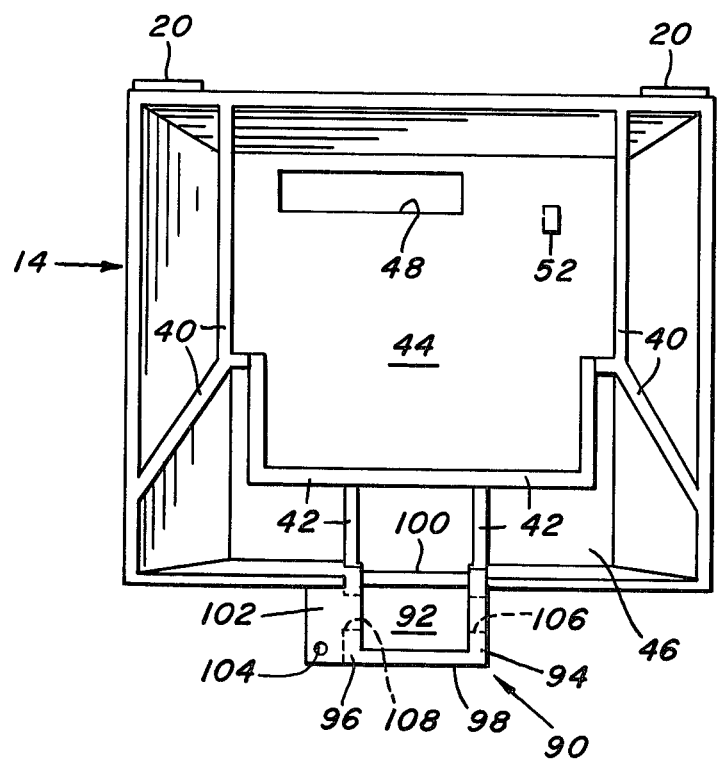
FIG. 6 is a view of the inside of the cover member.

Referring now to FIG. 6, in addition to ribs 40, which are as high as the outer walls, there are additional, shorter ribs 42 which reinforce the cover planar surface and also help to retain the counter in position. A plate 44 is fixed to the underside of top 46 of cover 14. Plate 44 has an opening 48 cut in it for reading the number wheels 50 (FIG. 1) of the counter. In addition, a boss 52 is molded on the inside of cover 14, in a position to co-operate with the counter assembly to maintain it in position. This boss 52 projects through a hole 54 in plate 44, helping to position plate 44 as well as retaining the counter assembly.

I now direct attention to the means for interlocking base 12 and cover 14, to prevent tampering with the counter. Base 12 has recesses 18 for receiving cover projections 20, as described above. In addition, referring to the figures, base 12 is molded with a fastening assembly 56.

Figures 3, 4:
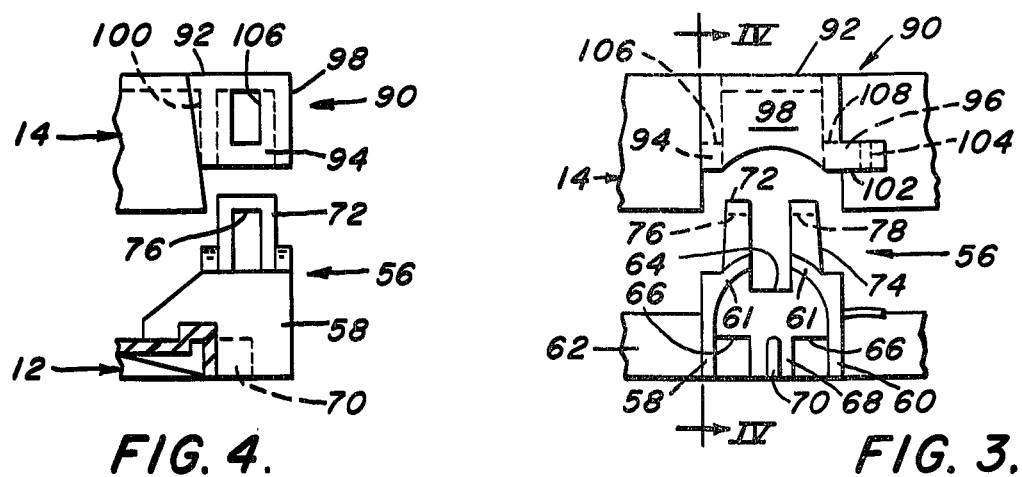
FIG. 3 is a view of the interlocking portions of the housing, with the two portions separated for clarity.
FIG. 4 is a section along IV — IV of FIG. 3.

Assembly 56 is an arch-shaped member having parallel sides 58 and 60 and a connecting arch portion 61, all protruding downwardly as seen in FIGS. 1 and 5, or forwardly as seen in FIGS. 2, 3 and 4, from the bottom edge 62 of base 12. A slot 64, FIGS. 2 and 3, is formed at the top of arch 61 to provide access for the connecting wiring (not shown) to the counter.

Referring now to FIGS. 2, 3 and 4, we see that the bottom edge 62 of the base 12 is cut out, as at 66, for drainage. In the event moisture works its way between base 12 and the surface on which it is mounted in use (not shown), these openings 66 allow for drainage. On the portion 68 of bottom edge 62 remaining between the drainage holes 66, is a projection 70, which maintains the connecting wires in the proper spacing to the housing.

Still referring primarily to FIGS. 2, 3 and 4, spaced-apart parallel upstanding legs 72 and 74 are mounted atop arch 61 in a position to form a continuation of slot 64. From the side, as viewed in FIG. 4, these legs each have an inverted U shape. The openings 76 and 78 in legs 72 and 74 respectively, are for a purpose to be discussed later.

Referring now to FIGS. 1, 2 and 5, it will be seen that a pin 80 at the end of a strap 82 is molded integrally with base 12. Strap 82 is conncted to the outer side of leg 60 a short distance from the edge 62 of base 12. At the base of pin 80 is an enlarged portion 84 connecting pin 80 with strap 82. Enlarged portion 84 has a through hold 86 for reception of a locking means 88, to be more fully described later. Pin 80 is preferably rectangular or square in transverse cross-section, and relatively sturdy, while strap 82 is thin enough to be relatively flexible.

Referring once again to the figures, it will be seen that cover 14 is installed upon base 12 by inserting projections 20 of the cover into recesses 18 of the base, and pulling the two members together, so that a hollow box-like assembly 90 is brought down around the upstanding legs 72 and 74 of the base 12. The assembly 90 projects from the bottom of cover 14 as seen in FIGS. 1 and 6, and from the front as seen in FIGS. 2 and 3. Assembly 90 is open on the bottom and has a top 92 flush with the top surface 46 of cover 14; depending legs 94 and 96 and front wall 98 project downwardly as seen in FIGS. 2, 3 and 4, for enclosing legs 72 and 74 of base fastening assembly 56. A vertical black wall 100 is molded with its inner surface parallel to the inner surface of front wall 98 for closely receiving legs 72 and 74.

Projecting to the right as viewed in FIGS. 1, 2 and 3 is a shelf-like member 102, having a hole 104. This shelf projects downwardly as seen in FIG. 1, and forwardly as seen in FIGS. 2 and 3, from the bottom (or front) wall of cover 14 co-extensive with, and is a part of, fastening assembly 90. As will be seen by inspection of FIGS. 1 and 2, hole 104 is placed to register with hole 86 of pin 80 when the assembly is completed.

In legs, or sidewalls, 94 and 96 are slots 106 and 108 respectively, producing rectangular-shaped openings aligned with openings 76 and 78 in upstanding legs 72 and 74, respectively. Thus, when cover 14 is placed on base 12 and pushed down into place, an aligned through opening is produced in the fastening assemblies 90 and 56. Pin 80 is dimensioned to closely fit the opening bounded by the sidewalls of the upstanding legs 72 and 74 of fastening assembly 56 and depending legs 94 and 96 of fastening assembly 90, tops (as seen in FIGS. 2, 3 and 4) of upstanding legs 72 and 74, and bottom of slots 106 and 108.

From the foregoing, it will be seen that cover 14 and base 12 are fastened tightly together by inserting projections 20 of cover 14 into recesses 18 of base 12, then pulling fastening assembly 90 down over fastening assembly 56 of base 12, and then inserting pin 80 through the aligned openings. The final step in preventing unauthorized entry to the housing is the passing of a suitable locking means 88 through aligned holes 86 and 104. Illustrated is the most common locking means, a wire passed through the holes with a seal fastening the ends. The locking means takes no stress in maintaining the cover and base together, this being done by pin 80 bearing on the tops of upstanding legs 72 and 74 and on the bottoms of depending legs 94 and 96. Thus, to efect entry to the housing, the locking means 88 must be parted and the pin 80 removed, or the housing must be attacked with a hammer or the like. In any event, undetected entry by dishonest persons is impossible.

What is claimed:

1. A tamperproof housing for a remote counter comprising, a base member molded of impact-resistant material having provision for mounting said counter, and a cover member of impact-resistant material having interengaging portions when assembled with said base, said interengaging portions being tongue and groove members on one mating surface of said base and said cover, and upstanding leg members projecting from an opposed surface of said base, said leg members cooperating with said cover to retain said tongue and groove members in assembled relation, and a locking pin integral with said base for retaining said base and said cover together when said members are assembled.

2. The tamperproof housing of claim 1, wherein said cover member includes a close-fitting shroud member surrounding said upstanding leg members, and having openings in the sides of said shroud aligned with said openings in said leg members, whereby said locking pin can extend through both sides of said shroud and said leg members.

3. The tamperproof housing of claim 1, wherein said cover member has integrally molded thereon a ledge for reception of a shoulder of said locking pin, said ledge and said shoulder having means for reception of a sealing means.

4. A tamperproof housing for a counter comprising; a base member having provision for mounting on a planar supporting surface, mounting means accessible from within said housing for fixing said base to said supporting surface, said base member also having provision for mounting said counter; a cover member having a display window for reading said counter and interfitting surfaces with said base member providing a snug closure; tongue and groove members on one interfitting surface, and upstanding leg members projecting from an opposed surface of said base, said leg members cooperating by means of a close-fitting shroud integral with said cover to retain said tongue and groove members in assembled relation, and a locking pin integral with one of said members for retaining said base and said cover togeter when said members are assembled; said projection and said shroud being laterally pierced for reception of said locking pin.

* * * * *

UNITED STATES PATENT AND TRADEMARK OFFICE
CERTIFICATE OF CORRECTION

PATENT NO. : 4,106,344
DATED : August 15, 1978
INVENTOR(S) : Eberhard Moll

It is certified that error appears in the above–identified patent and that said Letters Patent are hereby corrected as shown below:

Column 1, line 10, delete "users" and insert --uses--.

Column 3, line 45, delete "efect" and insert --effect--.

Signed and Sealed this

Twentieth Day of February 1979

[SEAL]

Attest:

RUTH C. MASON
Attesting Officer

DONALD W. BANNER
Commissioner of Patents and Trademarks